(12) United States Patent
Tsaur et al.

(10) Patent No.: US 10,431,975 B2
(45) Date of Patent: Oct. 1, 2019

(54) CROSS-DOMAIN ESD PROTECTION CIRCUIT

(71) Applicant: Realtek Semiconductor Corp., Hsinchu (TW)

(72) Inventors: Tay-Her Tsaur, Tainan (TW); Cheng-Cheng Yen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 308 days.

(21) Appl. No.: 15/673,914

(22) Filed: Aug. 10, 2017

(65) Prior Publication Data

US 2018/0097355 A1   Apr. 5, 2018

(30) Foreign Application Priority Data

Oct. 5, 2016   (TW) .............................. 105132276 A

(51) Int. Cl.
*H02H 9/04* (2006.01)
*H01L 27/02* (2006.01)
*H02H 3/20* (2006.01)

(52) U.S. Cl.
CPC .............. *H02H 9/04* (2013.01); *H02H 9/041* (2013.01); *H01L 27/0248* (2013.01); *H01L 27/0266* (2013.01); *H01L 27/0285* (2013.01); *H02H 3/20* (2013.01); *H02H 9/046* (2013.01)

(58) Field of Classification Search
USPC .......................................... 361/56, 91.1, 111
See application file for complete search history.

(56) References Cited

U.S. PATENT DOCUMENTS

| 4,797,899 A | 1/1989 | Fuller et al. |
| 5,946,177 A | 8/1999 | Miller et al. |
| 6,385,021 B1 | 5/2002 | Takeda et al. |

(Continued)

FOREIGN PATENT DOCUMENTS

CN    1612434 A    5/2005

OTHER PUBLICATIONS

Chinese Office Action and Search Report, dated Dec. 5, 2018 for Chinese Application No. 201610893311.4, with a partial English translation of the Chinese Office Action and an English translation of the Chinese Search Report.

(Continued)

*Primary Examiner* — Danny Nguyen
(74) *Attorney, Agent, or Firm* — Birch, Stewart, Kolasch & Birch, LLP

(57) ABSTRACT

An ESD protection circuit includes: a first current path switch arranged in a parallel connection with a first circuit and turned off when a first node voltage is at a logic high level; a first node for providing the first node voltage; a resister element coupled between a first power terminal and the first node; a MOS capacitor coupled between the first node and a first fixed-voltage terminal; a second current path switch arranged in a parallel connection with a second circuit and controlled by a second node voltage; a switch control circuit for providing the second node voltage; and a node voltage control circuit for controlling the first node voltage according to the second node voltage to ensure the first current path switch is turned off when the first power terminal supplies power to the first circuit while the second power terminal supplies power to the second circuit.

5 Claims, 2 Drawing Sheets

(56) References Cited

U.S. PATENT DOCUMENTS

| | | |
|---|---|---|
| 6,724,603 B2 | 4/2004 | Miller et al. |
| 6,989,979 B1 | 1/2006 | Tong et al. |
| 2005/0083623 A1* | 4/2005 | Yeh .................... H01L 27/0259 361/56 |
| 2013/0120885 A1* | 5/2013 | Keramat ............. H01L 27/0292 361/56 |

OTHER PUBLICATIONS

Chinese Office Action and Search Report, dated Dec. 5, 2018 for Chinese Application No. 201610893366.5, with a partial English translation of the Chinese Office Action and an English translation of the Chinese Search Report.

* cited by examiner

CROSS-DOMAIN ESD PROTECTION CIRCUIT

CROSS-REFERENCE TO RELATED APPLICATIONS

This application claims the benefit of priority to Patent Application No. TW 105132276, filed in Taiwan on Oct. 5, 2016; the entirety of which is incorporated herein by reference for all purposes.

BACKGROUND

The disclosure generally relates to an ESD protection circuit and, more particularly, to a cross-domain ESD protection circuit.

In an integrated circuit, the ESD protection circuit is typically connected with other circuits in a parallel connection to provide a discharging path for those circuits. The capacitors in the conventional ESD protection circuit are typically realized with MOS capacitors in order to reduce the circuit area.

However, in many advanced semiconductor manufacturing processes, the MOS capacitor might easily suffer the gate leakage problem because the gate oxide layer of the MOS capacitor has become much thinner than before. As a result, the ESD protection circuit may erroneously act during normal operations of other circuits, thereby causing malfunction of the integrated circuit or rendering the integrated circuit to be unable to conduct normal operations.

SUMMARY

An example embodiment of a cross-domain ESD protection circuit is disclosed, comprising: a first current path switch positioned on a first current path between a first power terminal and a first fixed-voltage terminal, arranged in a parallel connection with a first circuit, and arranged to be operably turned off when a first node voltage is at a logic high level; a first node coupled with a control terminal of the first current path switch, and arranged to operably provide the first node voltage; a first resister element coupled between the first power terminal and the first node; a first MOS capacitor coupled between the first node and the first fixed-voltage terminal, and arranged to be operably charged when the first node voltage is at the logic high level; a second current path switch positioned on a second current path between a second power terminal and a second fixed-voltage terminal, arranged in a parallel connection with a second circuit, and arranged to be operably controlled by a second node voltage; a switch control circuit coupled between the second power terminal and the second fixed-voltage terminal, and arranged to operably provide the second node voltage; and a node voltage control circuit coupled with the first power terminal, the first node, and the switch control circuit, and arranged to operably control magnitude of the first node voltage according to the second node voltage when the first power terminal supplies power to the first circuit while the second power terminal supplies power to the second circuit to ensure the first current path switch to maintain in a turned-off status.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

Figure 1:
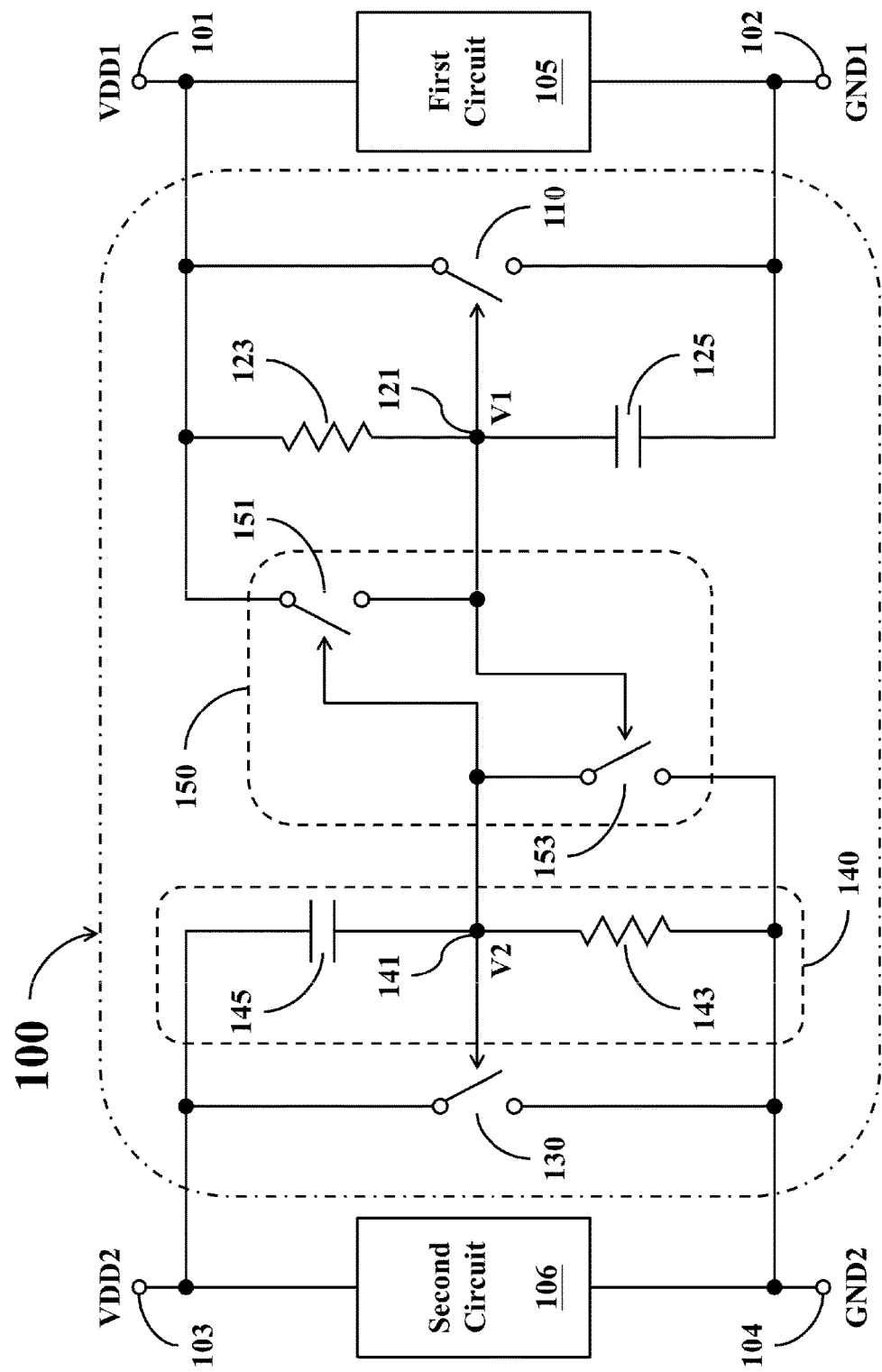
FIG. 1 shows a simplified functional block diagram of an ESD protection circuit according to a first embodiment of the present disclosure.

FIG. 1 shows a simplified functional block diagram of an ESD protection circuit 100 according to a first embodiment of the present disclosure. The right side of FIG. 1 shows a first power terminal 101, a first fixed-voltage terminal 102, and a first circuit 105 in a first power domain, while the first circuit 105 is coupled between the first power terminal 101 and the first fixed-voltage terminal 102. The left side of FIG. 1 shows a second power terminal 103, a second fixed-voltage terminal 104, and a second circuit 106 in a second power domain, while the second circuit 106 is coupled between the second power terminal 103 and the second fixed-voltage terminal 104. The first circuit 105 denotes any unspecific circuit which may encounter ESD impact in the first power domain, and the second circuit 106 denotes any unspecific circuit which may encounter ESD impact in the second power domain.

The first power terminal 101 is arranged to operably provide a first operating voltage VDD1 required for the operations of the first circuit 105, and the second power terminal 103 is arranged to operably provide a second operating voltage VDD2 required for the operations of the second circuit 106, wherein the first operating voltage VDD1 is different from the second operating voltage VDD2. The first fixed-voltage terminal 102 is coupled with a first fixed voltage GND1, and the second fixed-voltage terminal 104 is coupled with a second fixed voltage GND2. In practice, the first fixed voltage GND1 and the second fixed voltage GND2 may be of the same voltage level (e.g., 0V), or may be different from each other.

The ESD protection circuit 100 is utilized for protecting the first circuit 105 and the second circuit 106 from being damaged by ESD impact. Since the ESD protection circuit 100 is coupled with the first power terminal 101 and the first fixed-voltage terminal 102 in the first power domain, and also coupled with the second power terminal 103 and the second fixed-voltage terminal 104 in the second power domain, the ESD protection circuit 100 is thus a circuit bridging between two different power domains.

As shown in FIG. 1, the ESD protection circuit 100 comprises a first current path switch 110, a first node 121, a first resister element 123, a first MOS capacitor 125, a second current path switch 130, a switch control circuit 140, and a node voltage control circuit 150.

The first current path switch 110 is positioned on a first current path between the first power terminal 101 and the first fixed-voltage terminal 102, and is coupled with the first circuit 105 in a parallel connection. The first current path switch 110 is arranged to be operably turned off while a first node voltage V1 is at a logic high level, and arranged to be operably turned on while the first node voltage V1 is at a logic low level. The first node 121 is coupled with a control terminal of the first current path switch 110, and is arranged to operably provide the first node voltage V1. The first resister element 123 is coupled between the first power terminal 101 and the first node 121. The first MOS capacitor 125 is coupled between the first node 121 and the first fixed-voltage terminal 102, and is arranged to be operably charged while the first node voltage V1 is at the logic high level.

The second current path switch 130 is positioned on a second current path between the second power terminal 103 and the second fixed-voltage terminal 104, and is coupled with the second circuit 106 in a parallel connection. The second current path switch 130 is arranged to be operably controlled by a second node voltage V2. The switch control circuit 140 is coupled between the second power terminal 103 and the second fixed-voltage terminal 104, and is arranged to operably provide the second node voltage V2.

The node voltage control circuit 150 is coupled with the first power terminal 101, the first node 121, and the switch control circuit 140. The node voltage control circuit 150 is arranged to operably control the magnitude of the first node voltage V1 and/or the second node voltage V2 to ensure that the first current path switch 110 and/or the second current path switch 130 will not erroneously act to affect the normal operations of the first circuit 105 and the second circuit 106.

In one embodiment, the switch control circuit 140 comprises a second node 141, a second resister element 143, and a second MOS capacitor 145 which are coupled in a series connection. The node voltage control circuit 150 comprises a first bypass switch 151 and a second bypass switch 153.

When the first circuit 105 and the second circuit 106 do not need to operate, the first power terminal 101 and the second power terminal 103 may stop supplying power. In this situation, both the first current path switch 110 and the second current path switch 130 should be maintained in the turned-on status to render each of the first current path and the second current path with lower resistance to become a short circuit. As a result, the first current path and the second current path would both become current flow paths when the ESD event occurs, thereby preventing the first circuit 105 and the second circuit 106 from being damaged by the ESD impact.

On the other hand, when the first circuit 105 and the second circuit 106 need to conduct normal operations, the first power terminal 101 may supply power to the first circuit 105 and the second power terminal 103 may supply power to the second circuit 106. Ideally, both the first current path switch 110 and the second current path switch 130 should be maintain in the turned-off status to render each of the first current path and the second current path to become an open circuit. As a result, the current supplied by the first power terminal 101 is allowed to correctly flow to the first circuit 105, and the current supplied by the second power terminal 103 is allowed to correctly flow to the second circuit 106.

In the ESD protection circuit 100, the second current path switch 130 is arranged to be operably turned off while the second node voltage V2 is at a logic low level, and arranged to be operably turned on while the second node voltage V2 is at a logic high level. The second node 141 is coupled with a control terminal of the second current path switch 130, and is arranged to operably provide the second node voltage V2. The second resister element 143 is coupled between the second node 141 and the second fixed-voltage terminal 104. The second MOS capacitor 145 is coupled between the second power terminal 103 and the second node 141, and is arranged to be operably charged while the second node voltage V2 is at the logic low level.

The first bypass switch 151 is positioned on a first bypass path which is coupled with the first resister element 123 in a parallel connection. The first bypass switch 151 is arranged to be operably turned on while the second node voltage V2 is at the logic low level. The second bypass switch 153 is positioned on a second bypass path which is coupled with the second resister element 143 in a parallel connection. The second bypass switch 153 is arranged to be operably turned on while the first node voltage V1 is at the logic high level. In the embodiment of FIG. 1, a first terminal of the first bypass switch 151 is coupled with the first power terminal 101, a second terminal of the first bypass switch 151 is coupled with the first node 121, and a control terminal of the first bypass switch 151 is coupled with the second node 141. A first terminal of the second bypass switch 153 is coupled with the second node 141, a second terminal of the second bypass switch 153 is coupled with the second fixed-voltage terminal 104, and a control terminal of the second bypass switch 153 is coupled with the first node 121.

When the first power terminal 101 and the second power terminal 103 respectively supply power to the first circuit 105 and the second circuit 106, the first node voltage V1 initially provided by the first node 121 would be at the logic high level, and the second node voltage V2 initially provided by the second node 141 would be at the logic low level. In this situation, the first bypass switch 151 would be turned on by the second node voltage V2, and the second bypass switch 153 would be turned on by the first node voltage V1, so that each of the aforementioned first bypass path and second bypass path becomes a short circuit. Accordingly, the first node voltage V1 would be locked to the logic high level, and the second node voltage V2 would be locked to the logic low level.

Afterward, even if the first MOS capacitor 125 has gate leakage, the first node voltage V1 would not be pulled to the logic low level. On the other hand, even if the second MOS capacitor 145 has gate leakage, the second node voltage V2 would not be raised to the logic high level.

As a result, when the first circuit 105 and the second circuit 106 conduct normal operations, the node voltage control circuit 150 in FIG. 1 can effectively prevent the first current path switch 110 from being erroneously turned on by the gate leakage of the first MOS capacitor 125, and can also effectively prevent the second current path switch 130 from being erroneously turned on by the gate leakage of the second MOS capacitor 145.

Figure 2:
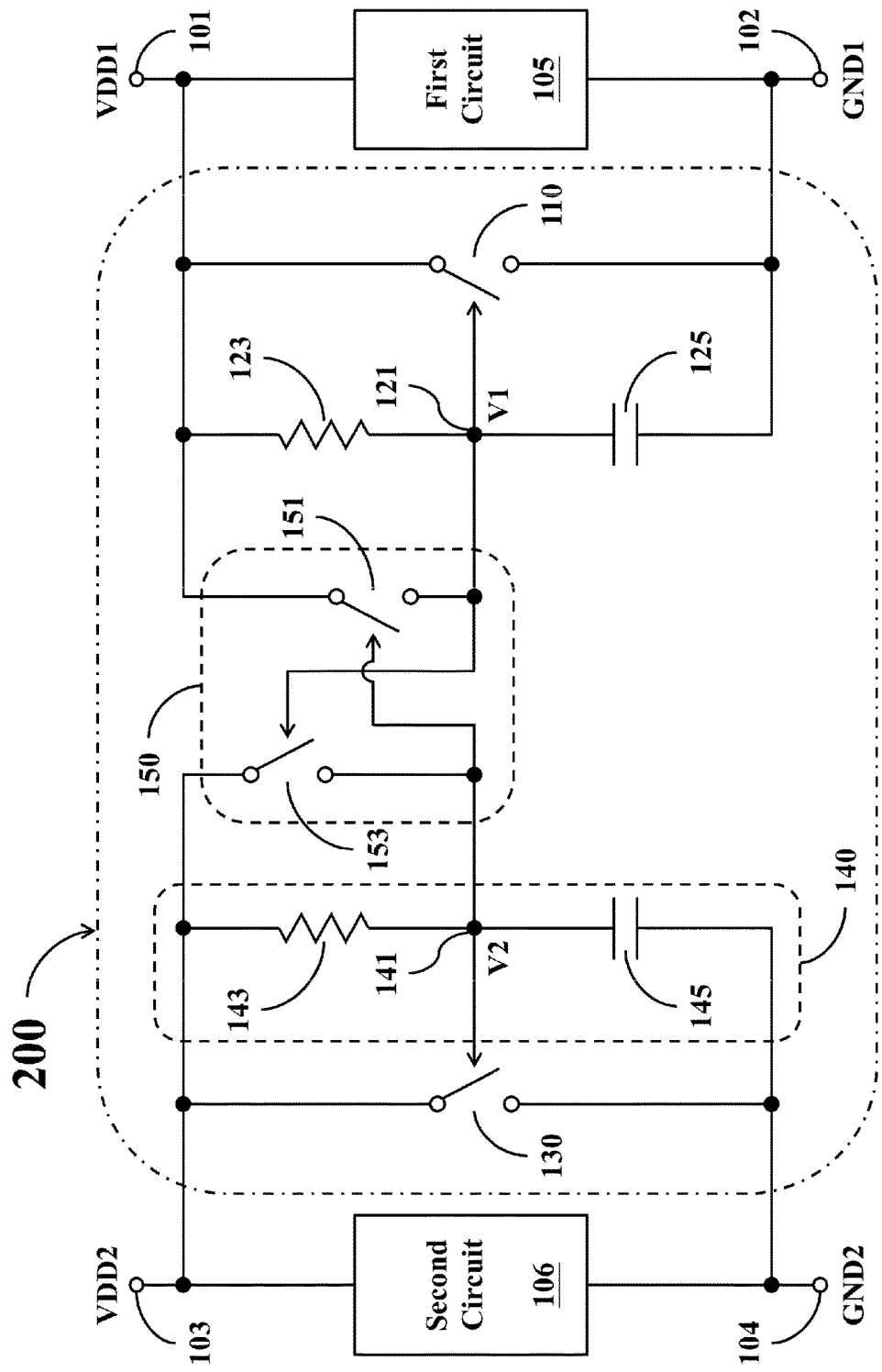
FIG. 2 shows a simplified functional block diagram of an ESD protection circuit according to a second embodiment of the present disclosure.

Please refer to FIG. 2, which shows a simplified functional block diagram of an ESD protection circuit 200 according to a second embodiment of the present disclosure.

In the ESD protection circuit 200, the second current path switch 130 is arranged to be operably turned off while the second node voltage V2 is at a logic high level, and arranged to be operably turned on while the second node voltage V2 is at a logic low level. The second node 141 is coupled with the control terminal of the second current path switch 130, and is arranged to operably provide the second node voltage V2. The second resister element 143 is coupled between the second power terminal 103 and the second node 141. The second MOS capacitor 145 is coupled between the second node 141 and the second fixed-voltage terminal 104, and is arranged to be operably charged while the second node voltage V2 is at the logic high level.

The first bypass switch 151 is positioned on a first bypass path which is coupled with the first resister element 123 in a parallel connection. The first bypass switch 151 is arranged to be operably turned on while the second node voltage V2 is at the logic high level. The second bypass switch 153 is positioned on a second bypass path which is coupled with the second resister element 143 in a parallel connection. The second bypass switch 153 is arranged to be operably turned on while the first node voltage V1 is at the logic high level. In the embodiment of FIG. 2, the first terminal of the first bypass switch 151 is coupled with the first power terminal 101, the second terminal of the first bypass switch 151 is coupled with the first node 121, and the control terminal of the first bypass switch 151 is coupled with the second node 141. The first terminal of the second bypass switch 153 is coupled with the second power terminal 103, the second terminal of the second bypass switch 153 is coupled with the second node 141, and the control terminal of the second bypass switch 153 is coupled with the first node 121.

When the first power terminal 101 and the second power terminal 103 respectively supply power to the first circuit 105 and the second circuit 106, the first node voltage V1 initially provided by the first node 121 would be at the logic high level, and the second node voltage V2 initially provided by the second node 141 would also be at the logic high level. In this situation, the first bypass switch 151 would be turned on by the second node voltage V2, and the second bypass switch 153 would be turned on by the first node voltage V1, so that each of the aforementioned first bypass path and second bypass path becomes a short circuit. Accordingly, the first node voltage V1 would be locked to the logic high level, and the second node voltage V2 would also be locked to the logic high level.

Afterward, even if the first MOS capacitor 125 has gate leakage, the first node voltage V1 would not be pulled to the logic low level. On the other hand, even if the second MOS capacitor 145 has gate leakage, the second node voltage V2 would not be pulled to the logic low level either.

As a result, when the first circuit 105 and the second circuit 106 conduct normal operations, the node voltage control circuit 150 in FIG. 2 can effectively prevent the first current path switch 110 from being erroneously turned on by the gate leakage of the first MOS capacitor 125, and can also effectively prevent the second current path switch 130 from being erroneously turned on by the gate leakage of the second MOS capacitor 145.

It can be appreciated from the foregoing descriptions that even if the first MOS capacitor 125 and the second MOS capacitor 145 have gate leakage, the node voltage control circuit 150 can still effectively lock the first node voltage V1 and the second node voltage V2 to correct logic level, so as to ensure that the first current path switch 110 and the second current path switch 130 would not act erroneously. Therefore, the aforementioned first MOS capacitor 125 and second MOS capacitor 145 can be manufactured by using more advanced semiconductor manufacturing technology to minimize the circuit areas of the first MOS capacitor 125 and the second MOS capacitor 145. As a result, the overall circuit area of the ESD protection circuit 100 or 200 can be minimized.

In each of the aforementioned embodiments, if any switch device among the first current path switch 110, the second current path switch 130, the first bypass switch 151, and the second bypass switch 153 is arranged to be operably turned on while the corresponding node voltage is at a logic high voltage (i.e., arranged to be operably turned off while the corresponding node voltage is at a logic low level), the switch device may be realized with a single n-type MOS (NMOS) transistor or a combination of an n-type MOS transistor and an even number of inverters coupled with the gate of the n-type MOS transistor in a series connection. Alternatively, the switch device may be realized with a combination of a p-type MOS (PMOS) transistor and an odd number of inverters coupled with the gate of the p-type MOS transistor in a series connection.

If any one of the aforementioned switch devices is arranged to be operably turned on while the corresponding node voltage is at a logic low level (i.e., arranged to be operably turned off while the corresponding node voltage is at a logic high level), the switch device may be realized with a single p-type MOS transistor or a combination of a p-type MOS transistor and an even number of inverters coupled with the gate of the p-type MOS transistor in a series connection. Alternatively, the switch device may be realized with a combination of an n-type MOS transistor and an odd number of inverters coupled with the gate of the n-type MOS transistor in a series connection.

In each of the aforementioned embodiments, if any capacitor device among the first MOS capacitor 125 and the second MOS capacitor 145 is arranged to be operably charged while the corresponding node voltage is at a logic high level, the main body of the capacitor device may be realized with a single n-type MOS transistor or a combination of an n-type MOS transistor and an even number of inverters coupled with the gate of the n-type MOS transistor in a series connection. Alternatively, the main body of capacitor device may be realized with a combination of a p-type MOS transistor and an odd number of inverters coupled with the gate of the p-type MOS transistor in a series connection.

If any one of the aforementioned capacitor devices is arranged to be operably charged while the corresponding node voltage is at a logic low level, the main body of the capacitor device may be realized with a single p-type MOS transistor, or a combination of a p-type MOS transistor and an even number of inverters coupled with the gate of the p-type MOS transistor in a series connection. Alternatively, the main body of capacitor device may be realized with a combination of an n-type MOS transistor and an odd number of inverters coupled with the gate of the n-type MOS transistor in a series connection.

Please note that the structures of the above ESD protection circuits 100 and 200 are merely exemplary embodiments, rather than restrictions to the practical implementations. In some embodiments, for example, the second MOS capacitor 145 in the switch control circuit 140 may be manufactured by using other semiconductor manufacturing technology capable of providing the second MOS capacitor 145 with a thicker gate oxide layer to prevent gate leakage. Additionally, in some applications where the second MOS capacitor 145 has no gate leakage, or the gate leakage of the second MOS capacitor 145 is suppressed by other circuit structures, the aforementioned second bypass switch 153 in the node voltage control circuit 150 may be omitted to simplify the circuit structure.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A cross-domain ESD protection circuit (100; 200), comprising:
   a first current path switch (110) positioned on a first current path between a first power terminal (101) and a first fixed-voltage terminal (102), arranged in a parallel connection with a first circuit (105), and arranged to be operably turned off when a first node voltage (V1) is at a logic high level;
   a first node (121) coupled with a control terminal of the first current path switch (110), and arranged to operably provide the first node voltage (V1);
   a first resister element (123) coupled between the first power terminal (101) and the first node (121);
   a first MOS capacitor (125) coupled between the first node (121) and the first fixed-voltage terminal (102), and arranged to be operably charged when the first node voltage (V1) is at the logic high level;
   a second current path switch (130) positioned on a second current path between a second power terminal (103) and a second fixed-voltage terminal (104), arranged in a parallel connection with a second circuit (106), and arranged to be operably controlled by a second node voltage (V2);
   a switch control circuit (140) coupled between the second power terminal (103) and the second fixed-voltage terminal (104), and arranged to operably provide the second node voltage (V2); and
   a node voltage control circuit (150) coupled with the first power terminal (101), the first node (121), and the switch control circuit (140), and arranged to operably control magnitude of the first node voltage (V1) according to the second node voltage (V2) when the first power terminal (101) supplies power to the first circuit (105) while the second power terminal (103) supplies power to the second circuit (106) to ensure the first current path switch (110) to maintain in a turned-off status.

2. The ESD protection circuit (100; 200) of claim 1, wherein the second current path switch (130) is arranged to be operably turned off when the second node voltage (V2) is at a logic low level, and the switch control circuit (140) comprises:
   a second node (141) coupled with a control terminal of the second current path switch (130), and arranged to operably provide the second node voltage (V2);
   a second resister element (143) coupled between the second node (141) and the second fixed-voltage terminal (104); and
   a second MOS capacitor (145) coupled between the second power terminal (103) and the second node (141), and arranged to be operably charged when the second node voltage (V2) is at the logic low level;
   wherein the node voltage control circuit (150) comprises:
   a first bypass switch (151) positioned on a first bypass path arranged in a parallel connection with the first resister element (123), and arranged to be operably turned on when the second node voltage (V2) is at the logic low level.

3. The ESD protection circuit (100; 200) of claim 2, wherein the node voltage control circuit (150) further comprises:
   a second bypass switch (153) positioned on a second bypass path arranged in a parallel connection with the second resister element (143), and arranged to be operably turned on when the first node voltage (V1) is at the logic high level.

4. The ESD protection circuit (100; 200) of claim 1, wherein the second current path switch (130) is arranged to be operably turned off when the second node voltage (V2) is at a logic high level, and the switch control circuit (140) comprises:
   a second node (141) coupled with a control terminal of the second current path switch (130), and arranged to operably provide the second node voltage (V2);
   a second resister element (143) coupled between the second power terminal (103) and the second node (141); and
   a second MOS capacitor (145) coupled between the second node (141) and the second fixed-voltage terminal (104), and arranged to be operably charged when the second node voltage (V2) is at the logic high level;
   wherein the node voltage control circuit (150) comprises:
   a first bypass switch (151) positioned on a first bypass path arranged in a parallel connection with the first resister element (123), and arranged to be operably turned on when the second node voltage (V2) is at the logic high level.

5. The ESD protection circuit (100; 200) of claim 4, wherein the node voltage control circuit (150) further comprises:
   a second bypass switch (153) positioned on a second bypass path arranged in a parallel connection with the second resister element (143), and arranged to be operably turned on when the first node voltage (V1) is at the logic high level.

* * * * *